United States Patent
Hata et al.

(10) Patent No.: US 9,093,309 B1
(45) Date of Patent: Jul. 28, 2015

(54) SEMICONDUCTOR DEVICE

(71) Applicant: Mitsubishi Electric Corporation, Tokyo (JP)

(72) Inventors: Tadayoshi Hata, Nagasaki (JP); Keizo Ogata, Nagasaki (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/535,919

(22) Filed: Nov. 7, 2014

(30) Foreign Application Priority Data

Jan. 6, 2014 (JP) ................. 2014-000502

(51) Int. Cl.
| | |
|---|---|
| *H01L 23/10* | (2006.01) |
| *B65D 55/10* | (2006.01) |
| *H01L 23/04* | (2006.01) |

(52) U.S. Cl.
CPC ............... *H01L 23/10* (2013.01); *B65D 55/10* (2013.01); *H01L 23/04* (2013.01)

(58) Field of Classification Search
CPC ........... H01L 2224/16225; H01L 2224/3225; H01L 2224/73265; H01L 2224/48091; H01L 2224/48227; H01L 2224/73204; H01L 2224/32145; H01L 23/49816; H01L 23/3128; H01L 23/49827; H01L 23/481; H01L 23/50; H01L 25/18; H01L 25/105; H01L 25/0657
USPC ................... 257/678, 98, 685–686, 777–778
See application file for complete search history.

(56) References Cited

U.S. PATENT DOCUMENTS 6,674,159 B1 * 1/2004 Peterson et al. ............... 257/680

FOREIGN PATENT DOCUMENTS

| JP | 10-65036 A | 3/1998 |
| JP | 2004-88036 A | 3/2004 |
| JP | 2009-135599 A | 6/2009 |

* cited by examiner

*Primary Examiner* — Hoa B Trinh
(74) *Attorney, Agent, or Firm* — Leydig, Voit & Mayer, Ltd.

(57) ABSTRACT

A semiconductor device includes: a package including a base plate and a side wall located on a perimeter of the base plate; a semiconductor element on the base plate; and a lid joined to a top of the side wall and covering the semiconductor element, wherein a first curved surface is located inside the package at the top of the side wall, a second curved surface is located on a perimeter of an undersurface of the lid, and the first curved surface of the side wall contacts the second curved surface of the lid.

6 Claims, 3 Drawing Sheets

SEMICONDUCTOR DEVICE

BACKGROUND OF THE INVENTION

1. Field of the Invention

The present invention relates to a semiconductor hermetically sealed package.

2. Background Art

In semiconductor hermetically sealed packages, a semiconductor element is mounted in a package and then a lid is seam-welded to secure air tightness. The package and the lid are positioned by pressing a protrusion provided on the lid against a package inner wall.

The protrusion of the lid is provided with a curved surface through press molding and the inner diameter of the package is designed in such a way that the package inner diameter does not interfere with this curved surface. This causes a backlash between the package and the lid to increase, causing the lid to stick out of the package. To solve this problem, a technique is proposed which provides the package and the lid with height differences respectively to make the lid to fit into the package (e.g., see Japanese Patent Laid-Open No. 10-65036).

SUMMARY OF THE INVENTION

In the prior art that provides height differences between the package and the lid, a large curved surface is produced when the height differences are formed by etching. Applying cutting to reduce this curved surface results in a cost increase. Moreover, since the curved surface cannot be reduced to 0, its positioning accuracy is low.

In view of the above-described problems, an object of the present invention is to provide a semiconductor device capable of improving positioning accuracy of the lid while reducing the cost.

According to the present invention, a semiconductor device includes: a package including a base plate and a side wall provided on a perimeter of the base plate; a semiconductor element on the base plate; and a lid joined to a top of the side wall and covering the semiconductor element, wherein a first curved surface is provided inside the package at the top of the side wall, a second curved surface is provided on a perimeter of an undersurface of the lid, and the first curved surface of the side wall is in contact with the second curved surface of the lid.

The present invention makes it possible to improve positioning accuracy of the lid while reducing the cost.

Other and further objects, features and advantages of the invention will appear more fully from the following description.

DETAILED DESCRIPTION OF THE PREFERRED EMBODIMENTS

Figure 1:
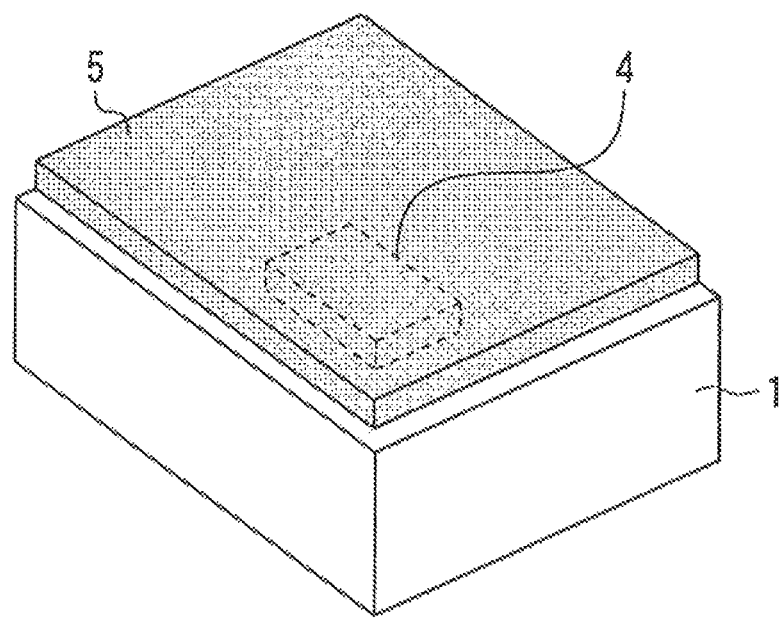
FIG. 1 is a perspective view illustrating a semiconductor device according to a first embodiment of the present invention.

A semiconductor device according to an embodiment of the present invention will be described with reference to the accompanying drawings. The same or corresponding components will be assigned the same reference numerals and duplicate description may be omitted.

First Embodiment

Figure 2:
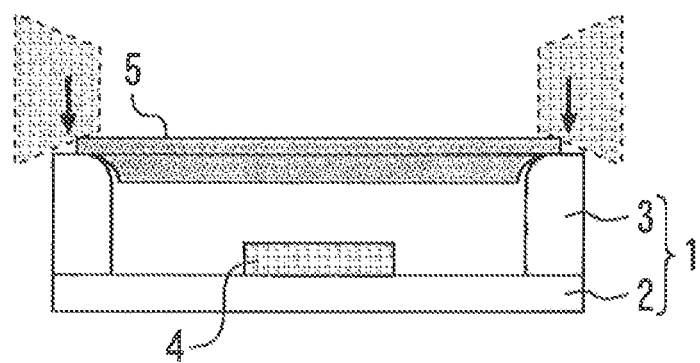
FIG. 2 is a cross-sectional view illustrating the semiconductor device according to the first embodiment of the present invention.

FIG. 1 is a perspective view illustrating a semiconductor device according to a first embodiment of the present invention. FIG. 2 is a cross-sectional view illustrating the semiconductor device according to the first embodiment of the present invention. A package 1 includes a base plate 2 and a side wall 3 provided on the perimeter of the base plate 2. The base plate 2 and the side wall 3 are rectangular in a plan view. A semiconductor element 4 is provided on the base plate 2. A lid 5 is joined to the top of the side wall 3 so as to cover the semiconductor element 4.

A curved surface (R) is provided inside the package 1 at the top of the side wall 3. A curved surface is provided on the perimeter of the undersurface of the lid 5. The perimeter of the lid 5 sits atop the side wall 3 and the curved surface of the side wall 3 is in contact with the curved surface of the lid 5. The radius of the curved surface of the side wall 3 is smaller than the radius of the curved surface of the lid 5.

The present embodiment provides the curved surfaces on the package 1 and the lid 5, and can thereby decrease a backlash between the two and improve positioning accuracy. In addition, the present embodiment can also reduce the cost compared to the prior art that provides height differences between the package and the lid. By making the radius of the curved surface of the side wall 3 smaller than the radius of the curved surface of the lid 5, it is possible to prevent the lid 5 from floating and forming a gap.

Second Embodiment

Figure 3:
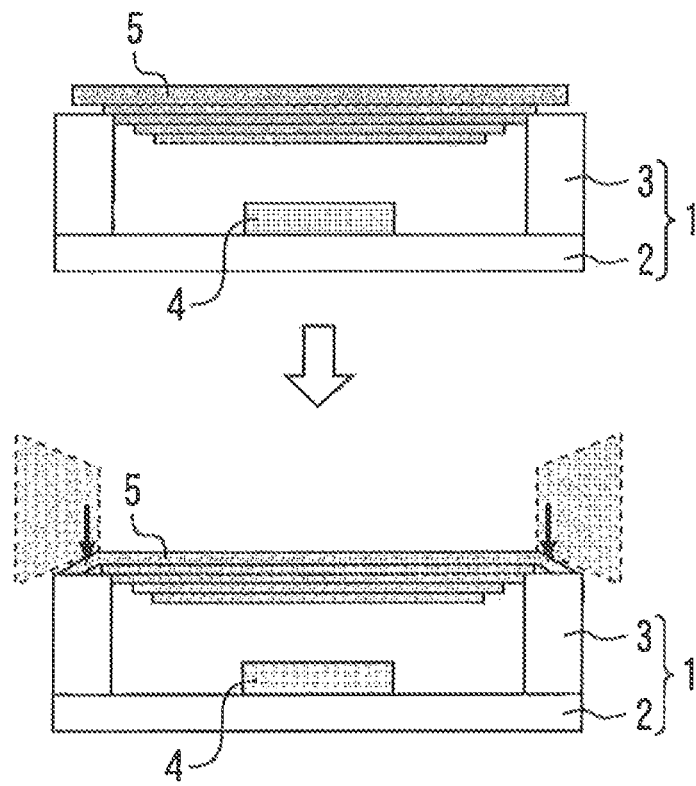
FIG. 3 is a cross-sectional view illustrating a semiconductor device according to a second embodiment of the present invention.

FIG. 3 is a cross-sectional view illustrating a semiconductor device according to a second embodiment of the present invention. The top of the side wall 3 has a rectangular shape. Step-like height differences are provided at the perimeter of the undersurface of the lid 5. At the top of the side wall 3, a corner inside the package 1 is in contact with a height difference of the lid 5. This prevents a backlash between the package 1 and the lid 5, and can thereby improve positioning accuracy.

However, a gap may be produced between the package 1 and the lid 5 in a condition in which the perimeter of the lid 5 sits atop the side wall 3, which may cause a welding fault. Thus, the lid 5 is made thinner and the lid 5 is made to deform under the load of the electrode during seam welding to eliminate any gap between the package 1 and the lid 5.

Furthermore, the lid 5 can be positioned by providing a height difference only on the lid 5 side and height differences need not be provided in both the lid 5 and the package 1. Therefore, it is possible to reduce the cost compared to the prior art that provides height differences between the package and the lid. Since the package 1 is provided with no height difference, the side wall 3 can be made thinner. This makes it possible to reduce the size of the outside shape of the package 1 while securing the inner region.

Third Embodiment

Figure 4:
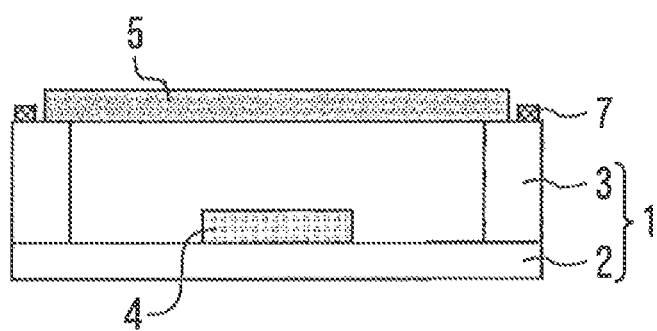
FIG. 4 is a cross-sectional view illustrating a semiconductor device according to a third embodiment of the present invention.
Figure 5:
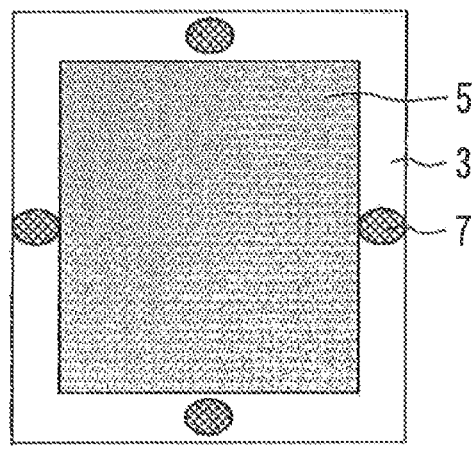
FIG. 5 is a top view illustrating the semiconductor device according to the third embodiment of the present invention.

FIG. 4 is a cross-sectional view illustrating a semiconductor device according to a third embodiment of the present invention. FIG. 5 is a top view illustrating the semiconductor device according to the third embodiment of the present invention. A plurality of pins 7 are provided as stoppers on four sides at the top of the side wall 3. The lid 5 is positioned by the plurality of pins 7.

This prevents the lid 5 from sticking out of the package 1 without providing any positioning structure in the lid 5. Moreover, while providing height differences in the package 1 or the lid 5 produces curved surfaces, only providing the pins 7 produces no curved surface, and it is thereby possible to improve positioning accuracy of the lid while reducing the cost.

Fourth Embodiment

Figure 6:
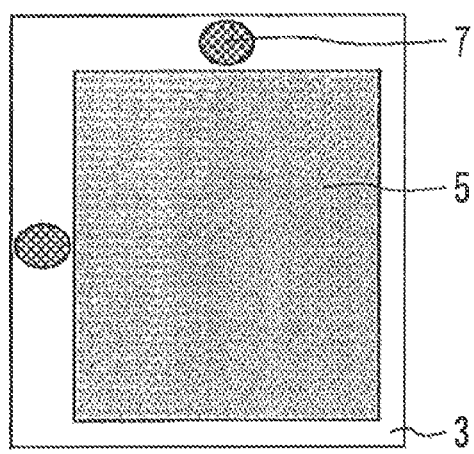
FIG. 6 is a top view illustrating a semiconductor device according to a fourth embodiment of the present invention.

FIG. 6 is a top view illustrating a semiconductor device according to a fourth embodiment of the present invention. The pins 7 are provided only on two sides of the rectangular side wall 3 in a plan view. The lid 5 is positioned by being pressed against the two pins 7 provided in one direction. This reduces by half an expansion of the outside shape of the package 1 caused by the positioning structure.

Fifth Embodiment

Figure 7:
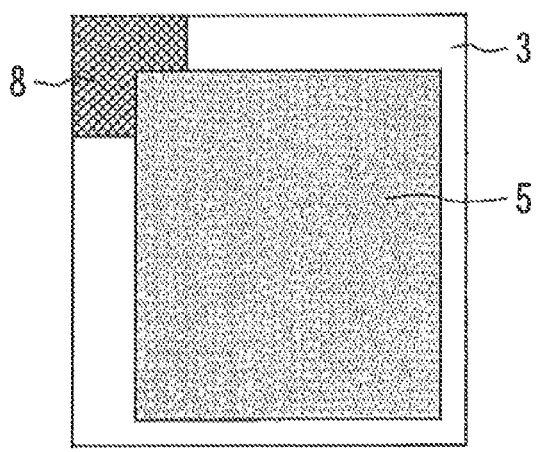
FIG. 7 is a top view illustrating a semiconductor device according to a fifth embodiment of the present invention.

FIG. 7 is a top view illustrating a semiconductor device according to a fifth embodiment of the present invention. The side wall 3 has a protrusion 8 at the top only in one corner of the side wall 3 which has a rectangular shape in a plan view. The protrusion 8 is formed by machining the side wall 3 of the package 1. The lid 5 is positioned by being pressed against the protrusion 8. This reduces by half the expansion of the outside shape of the package 1 caused by the positioning structure. Moreover, providing the positioning structure only in one direction, it is possible to reduce the size of the outside shape of the package 1 while securing the inner region.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-000502, filed on Jan. 6, 2014 including specification, claims, drawings, and summary, on which the Convention priority of the present application is based, is incorporated herein by reference in its entirety.

What is claimed is:
1. A semiconductor device comprising:
a package including a base plate and a side wall located on a perimeter of the base plate;
a semiconductor element on the base plate; and
a lid joined to a top of the side wall and covering the semiconductor element, wherein
a first curved surface is located inside the package at the top of the side wall,
a second curved surface is located on a perimeter of an undersurface of the lid, and
the first curved surface of the side wall contacts the second curved surface of the lid.
2. The semiconductor device according to claim 1, wherein a radius of the first curved surface of the side wall is smaller than a radius of the second curved surface of the lid.
3. A semiconductor device comprising:
a package including a base plate and a side wall located on a perimeter of the base plate, wherein the side wall has a planar top surface;
a semiconductor element on the base plate; and
a lid joined to the top surface of the side wall and covering the semiconductor element, wherein
the top surface of the side wall has a rectangular opening,
the lid has a top plate and a plurality of stepped protrusions extending from an undersurface of the top plate of the lid,
each adjacent pair of the protrusions forms a respective step,
at the top surface of the side wall, one of the steps contacts the top surface of the side wall, and
a peripheral edge of the top plate of the lid is bent toward and joined to the top surface of the side wall.
4. A semiconductor device comprising:
a package including a base plate and a side wall located on a perimeter of the base plate, wherein the side wall has a generally planar top surface;
a semiconductor element on the base plate;
a lid joined to the generally planar top surface of the side wall and covering the semiconductor element; and
a plurality of pins located on and protruding from the generally planar top surface of the side wall, wherein the lid is positioned on and in contact with the generally planar top surface of the side wall, and located beside and adjacent to the plurality of pins.
5. The semiconductor device according to claim 4, wherein the side wall has a rectangular shape with four sides, when viewed in a plan view transverse to the base plate, and only two of the sides of the side wall include pins of the plurality of pins on the generally planar top surface of the side wall.
6. A semiconductor device comprising:
a package including a base plate and a side wall located on a perimeter of the base plate, wherein the side wall has a generally planar top surface;
a semiconductor element on the base plate; and
a lid having a shape with at least one outside corner, joined to the generally top surface of the side wall and covering the semiconductor element, wherein
the generally planar top surface of the side wall includes a protrusion located at only one corner of the generally planar top surface of the side wall, and protruding from the generally planar top surface of the side wall,
the protrusion includes, when viewed in a plan view transverse to the base plate, an inside corner, and
the outside corner of the lid is located within the inside corner of the protrusion and contacts the protrusion.

* * * * *